US012583222B2

(12) United States Patent　　　　(10) Patent No.:　US 12,583,222 B2
Weaver　　　　　　　　　　　　　(45) Date of Patent:　　Mar. 24, 2026

(54) SOLVENT COMPATIBLE NOZZLE PLATE

(71) Applicant: Brady Worldwide, Inc., Milwaukee, WI (US)

(72) Inventor: Sean T. Weaver, Lexington, KY (US)

(73) Assignee: BRADY WORLDWIDE, INC., Milwaukee, WI (US)

( * ) Notice: Subject to any disclaimer, the term of this patent is extended or adjusted under 35 U.S.C. 154(b) by 146 days.

(21) Appl. No.: 18/593,420

(22) Filed: Mar. 1, 2024

(65) Prior Publication Data

US 2024/0198675 A1　　Jun. 20, 2024

Related U.S. Application Data

(62) Division of application No. 17/206,344, filed on Mar. 19, 2021, now Pat. No. 11,958,292.

(51) Int. Cl.
| | |
|---|---|
| *B41J 2/14* | (2006.01) |
| *B41J 2/16* | (2006.01) |
| *G03F 7/004* | (2006.01) |
| *G03F 7/038* | (2006.01) |
| *G03F 7/075* | (2006.01) |
| *G03F 7/09* | (2006.01) |
| *G03F 7/11* | (2006.01) |
| *G03F 7/40* | (2006.01) |

(52) U.S. Cl.
CPC ........... *B41J 2/1433* (2013.01); *B41J 2/1603* (2013.01); *B41J 2/162* (2013.01); *B41J 2/1623* (2013.01); *B41J 2/1626* (2013.01); *B41J 2/1631* (2013.01); *B41J 2/164* (2013.01); *G03F 7/004* (2013.01); *G03F 7/0045* (2013.01); *G03F 7/0046* (2013.01);

*G03F 7/038* (2013.01); *G03F 7/0755* (2013.01); *G03F 7/094* (2013.01); *G03F 7/11* (2013.01); *G03F 7/40* (2013.01); *B41J 2202/03* (2013.01)

(58) Field of Classification Search
CPC ........ B41J 2/1433; B41J 2/1603; B41J 2/162; B41J 2/1623; B41J 2/1626; B41J 2/1631; B41J 2/164; B41J 2202/03; B41J 2/01; B41J 2/211; B41J 2/17; B41J 2/17593; B41J 2/2107; B41J 2/1755; B41J 2/2114; B41J 2/2117; B41J 2/2056; B41J 2/21; B41J 2/0057; B41J 3/60; B41J 2002/012; B41J 2/04598; B41J 2202/00; B41J 2/14201; B41J 2/045; B41J 11/0015; B41J 11/002; B41J 2/04581; B41J 2/055; B41J 2/16538; B41J 2002/16502; G03F 7/004; G03F 7/0046; G03F 7/038; G03F 7/094; G03F 7/11; G03F 7/40; G03F 7/0045; G03F 7/0755; G03F 7/095; B05B 1/00

See application file for complete search history.

(56) References Cited

U.S. PATENT DOCUMENTS

| | | | |
|---|---|---|---|
| 4,509,063 | A | 4/1985 | Sugitani et al. |
| 6,193,359 | B1 | 2/2001 | Patil et al. |
| 6,509,137 | B1 | 1/2003 | Wang et al. |
| 6,709,805 | B1 | 3/2004 | Patil |
| 6,790,309 | B2 | 9/2004 | Miyagawa et al. |

(Continued)

*Primary Examiner* — Manish S Shah
(74) *Attorney, Agent, or Firm* — Brianna Schonenberg

(57) ABSTRACT

A composite photoresist material and method of making the composite photoresist material. The composite photoresist material includes: a photoresist layer devoid of a phenoxy resin, and a photoresist layer containing a phenoxy resin.

17 Claims, 4 Drawing Sheets

(56) References Cited

U.S. PATENT DOCUMENTS

| | | | |
|---|---|---|---|
| 7,481,942 B2 | 1/2009 | Min et al. | |
| 7,879,536 B2 | 2/2011 | Shin et al. | |
| 8,353,574 B1 | 1/2013 | Heuft et al. | |
| 9,855,566 B1 | 1/2018 | Craft et al. | |
| 2007/0076053 A1* | 4/2007 | Hart ...................... | B41J 2/1631 |
| | | | 216/27 |
| 2009/0091600 A1* | 4/2009 | Fannin ................... | B41J 2/1645 |
| | | | 347/45 |
| 2009/0155729 A1* | 6/2009 | Weaver ................. | B41J 2/1631 |
| | | | 430/320 |
| 2019/0056659 A1* | 2/2019 | Craft ..................... | B41J 2/1639 |
| 2019/0056660 A1 | 2/2019 | Bernard et al. | |

* cited by examiner

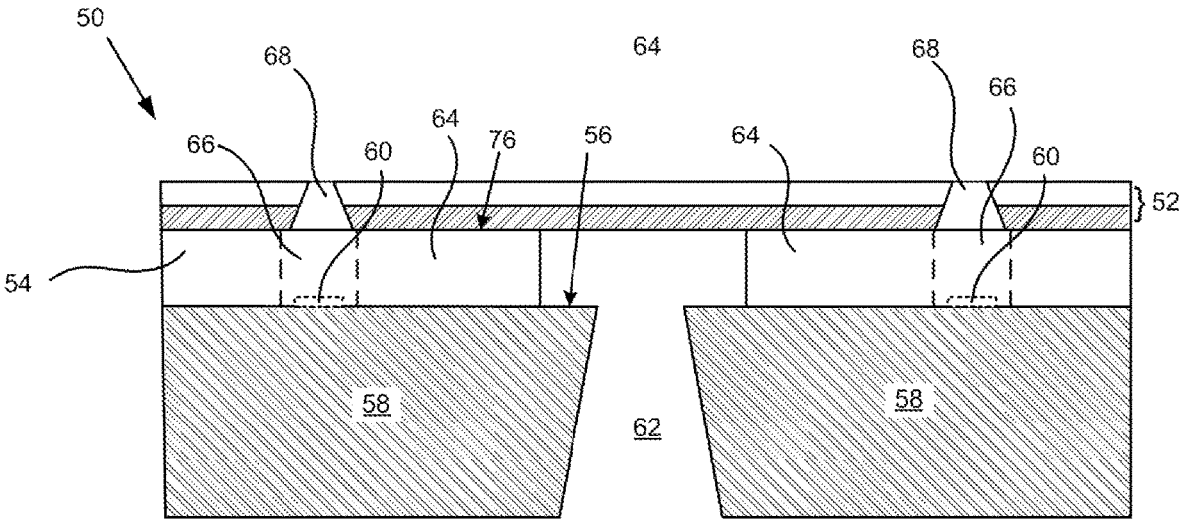
FIG. 3
Prior Art
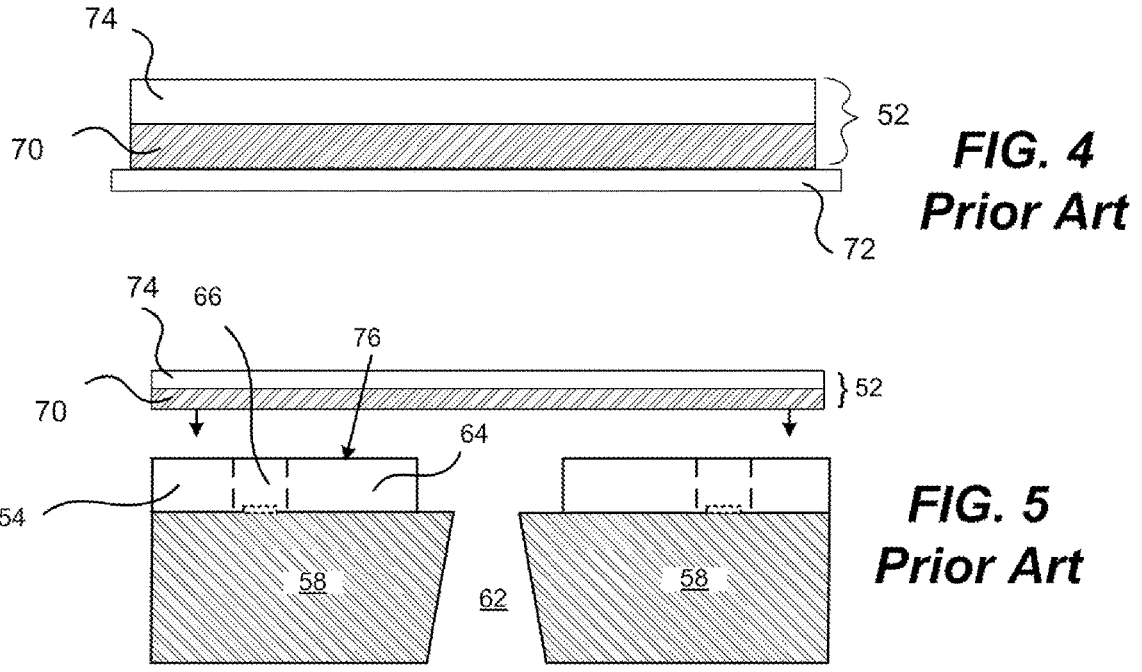
FIG. 4
Prior Art
FIG. 5
Prior Art

SOLVENT COMPATIBLE NOZZLE PLATE

RELATED APPLICATION

This application is a division of application Ser. No. 17/206,344, filed Mar. 19, 2021, now allowed.

TECHNICAL FIELD

The disclosure relates to improved fluid ejection heads and in particular to methods for fabricating solvent-resistant nozzle plates for ejection heads.

BACKGROUND AND SUMMARY

Micro-electromechanical systems ("MEMS") and nano-devices typically include three-dimensional ("3D") structures made from photoimaged materials. Examples of MEMS and nano-devices include, but are not limited to fluid ejection heads, micro-filters, micro-separators, micro-sieves, and other micro and nano scale fluid handling structures. Such structures may handle a wide variety of fluids. For example, fluid ejection heads are nano devices that are useful for ejecting a variety of fluids including inks, cooling fluids, pharmaceuticals, lubricants, and the like. Fluid ejection heads may also be used in vaporization devices for vapor therapy, E-cigarettes, and the like.

The fluid ejection head is a seemingly simple device that has a relatively complicated structure containing electrical circuits, ink passageways and a variety of tiny parts assembled with precision to provide a powerful, yet versatile fluid ejection head. The components of the ejection head must cooperate with each other and be useful for a variety of fluids and fluid formulations. Accordingly, it is important to match the ejection head components to the fluid being ejected.

The primary components of a fluid ejection head are a semiconductor substrate, a flow feature layer, a nozzle plate layer, and a flexible circuit attached to the substrate. The semiconductor substrate is preferably made of silicon and contains various passivation layers, conductive metal layers, resistive layers, insulative layers and protective layers deposited on a device surface thereof. Fluid ejection actuators formed on a device surface of the substrate may be thermal actuators, bubble jet actuators, or piezoelectric actuators. For thermal actuators, individual heater resistors are defined in the resistive layers and each heater resistor corresponds to a nozzle hole in the nozzle plate for heating and ejecting fluid from the ejection head toward a desired substrate or target.

Current methods used to make the flow feature layer and nozzle plate layer involve the use of the combination of spin on photoresist or dry film photoresist with multiple image, develop, and bake steps for each layer. For example, in a conventional process, a first adhesion promotion layer is applied to a semiconductor substrate, a flow feature layer of photoimageable material is spin coated onto the adhesion layer. The flow feature layer is a negative photoresist layer that is imaged, developed, and cured. A second adhesion promotion layer is applied to the flow feature layer before applying a nozzle layer. A fluid supply via is etched through the semiconductor substrate using a DRIE process. Finally, the photoimageable layer nozzle layer is laminated as a dry film to the flow feature layer by means of the secondary adhesion promotion layer. The nozzle layer is imaged, developed, and cured.

In a variation of the process, the DRIE process is conducted after the flow feature layer is applied to the substrate and the flow feature layer is imaged and developed. Subsequent to the DRIE process, the nozzle plate layer is laminated to the flow feature layer and the nozzle plate layer is imaged and developed.

An area of the construction of the fluid jet ejection heads that remains problematic is the compatibility of the nozzle plate with a wide variety of fluids. Conventional nozzle plates are made of materials that are readily compatible with water-based fluids. However, solvent-based fluids have been found to react negatively with conventional photoresist nozzle plate materials. For example, certain solvents and perfumes may attack the phenoxy resin used in conventional nozzle plate materials that are laminated to a flow feature layer of an ejection head. Accordingly, there is a need to improve the solvent compatibility of a nozzle plate for an ejection head that ejects organic fluids that are incompatible with materials used to make the nozzle plates.

Accordingly, an embodiment of the disclosure provides a composite photoresist material and a method for making a composite photoresist material. The composite photoresist material includes a photoresist layer devoid of a phenoxy resin, and a photoresist layer containing a phenoxy resin.

In another embodiment, there is provided a method for making a composite photoresist laminate material. The method includes the steps of:
- applying a layer of photoresist material to a carrier film, the layer of photoresist material comprising a phenoxy resin;
- drying the layer to provide a dried layer;
- applying a layer of photoresist material devoid of a phenoxy resin to the dried layer; and
- drying the layer devoid of the phenoxy resin to provide the composite photoresist laminate material.

Another embodiment provides a fluid ejection head. The fluid ejection head includes a semiconductor substrate containing a plurality fluid ejection actuators on a device surface thereof and one or more fluid supply vias etched therethrough. A flow feature layer is applied to the device surface of the semiconductor substrate. The flow feature layer has fluid channels and fluid ejection chambers imaged and developed therein. A composite photoresist material is laminated to the flow feature layer. The composite photoresist material has a photoresist layer devoid of a phenoxy resin adjacent to the flow feature layer, and a photoresist layer comprising a phenoxy resin adjacent to the photoresist layer devoid of a phenoxy resin.

In some embodiments, the composite photoresist material is coated onto a release liner.

In some embodiments, the photoresist layer devoid of a phenoxy resin is also devoid of a hydrophobicity agent.

In some embodiments, the photoresist layer devoid of a phenoxy resin has a thickness ranging from about 3 to about 10 microns.

In some embodiments, the photoresist layer containing a phenoxy resin has a thickness ranging from about 3 to about 20 microns.

In some embodiments, the composite photoresist material further includes a third photoresist layer adjacent to the photoresist layer containing the phenoxy resin, wherein the third photoresist layer contains a phenoxy resin and a hydrophobicity agent.

In some embodiments, the third photoresist layer has a thickness ranging from about 3 to about 20 microns.

In some embodiments, the hydrophobicity agent is selected from the group consisting of heptadecafluorodecyltrimethoxysilane, octadecyldimethylchlorosilane, octadecyltrichlorosilane, octadecyltrichlorosilane methyltrimethoxysilane, octyltriethoxysilane, phenyltrimethoxysilane, t-butylmethoxysilane, tetraethoxysilane, sodium methyl siliconate, vinyltrimethoxysilane, N-(3-(trimethoxysilyl)propyl)ethylenediamine, polymethylmethoxysiloxane, polydimethylsiloxane, polyethylhydrogensiloxane, and dimethyl siloxane.

In some embodiments, nozzle holes are imaged and developed in the composite photoresist laminate material.

In some embodiments, the layer of photoresist material applied to the carrier film comprises a first layer of photoresist material containing a phenoxy resin and a hydrophobicity agent and a second layer of photoresist material containing a phenoxy resin, wherein the second layer of photoresist material is devoid of a hydrophobicity agent.

An advantage of the disclosed embodiments is an improved resistance of the composite photoresist material to a wide variety of non-aqueous fluids. Accordingly, an ejection head containing the composite photoresist material as a nozzle plate may be used to eject fluids that otherwise are incompatible with conventional nozzle plate materials.

BRIEF DESCRIPTION OF THE DRAWINGS

FIG. 3 is a cross-sectional view of a prior art ejection head.

FIG. 4 is a cross-sectional view, not to scale, of a prior art composite photoresist material for a nozzle plate of the ejection head of FIG. 3

FIG. 5 is a schematic illustration, not to scale, of the prior art composite photoresist material of FIG. 2 being laminated to a flow feature layer of the ejection head of FIG. 3.

DETAILED DESCRIPTION

Figure 1:
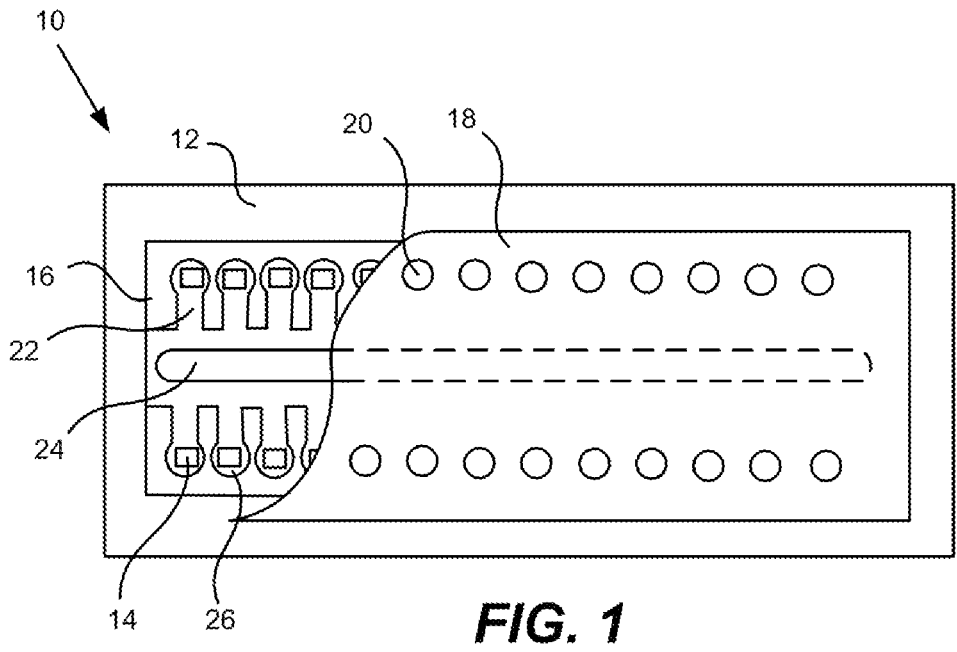
FIG. 1 is a plan, cut-away view, not to scale, of an ejection head according to the disclosure.

With reference to FIG. 1 there is shown simplified representations of portions of an ejection head 10 containing a semiconductor substrate 12, fluid ejectors 14, a flow feature layer 16, and a nozzle plate 18 containing nozzle holes 20 therein. The flow feature layer 16 includes fluid channels 22 leading from a fluid supply via 24 in the semiconductor substrate to a fluid ejection chamber 26 containing the fluid ejectors 14. The semiconductor substrate 12 is preferably a silicon semiconductor substrate 12 containing a plurality of fluid ejectors 14 such as piezoelectric devices or heater resistors formed on a device side of the substrate 12. Fluid supplied through one or more fluid supply vias 24 in the semiconductor substrate 12 flows through the fluid supply channel 22 to a fluid ejection chamber 26 formed in the flow feature layer 16 where the fluid is caused to be ejected through a nozzle hole 20 in the nozzle plate 18 when the fluid ejector 14 is activated.

Figure 2:
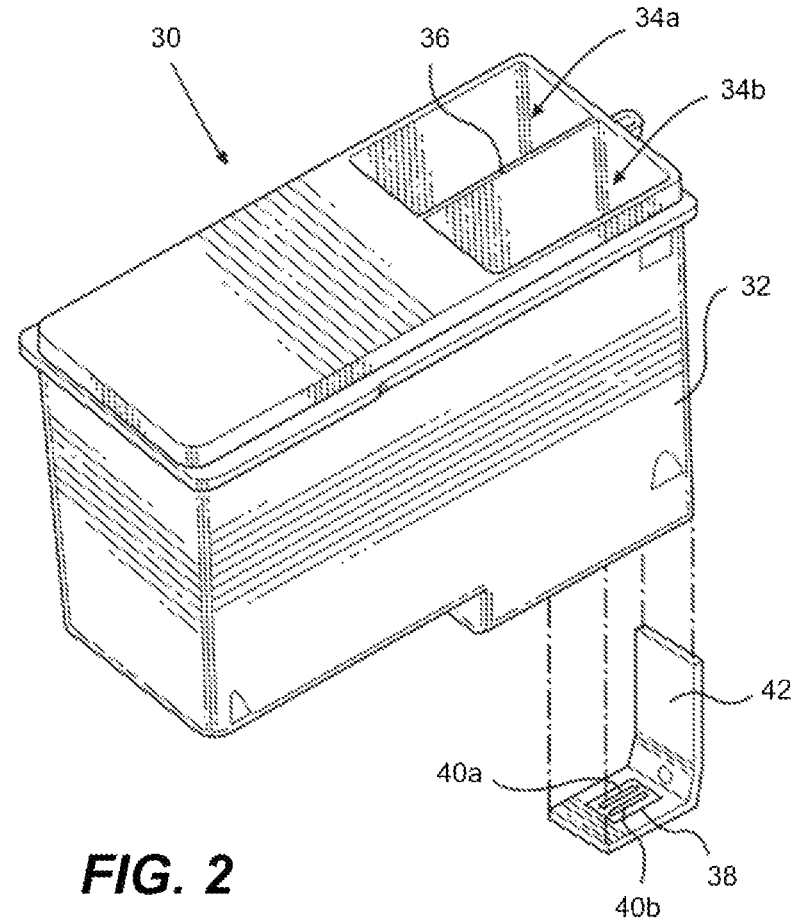
FIG. 2 is a perspective view, not to scale, of a fluid cartridge for the fluid ejection head of FIG. 1.

FIG. 2 is an illustration of a fluid cartridge 30 having a cartridge body 32 containing fluid supply chambers 34a and 34b and a dividing wall 36 between the fluid supply chambers 34a and 34b. An ejection head 38, similar to ejection head 10 described above, containing two fluid supply vias 40a and 40b corresponding to fluid chambers 34a and 34b is attached by means of a flexible circuit 42 to the fluid cartridge 30. The flexible circuit provides electrical connection to a fluid ejection device to activate the fluid ejectors on the ejection head 38.

As described above, if the fluids provided to fluid chambers 34a and 34b are non-aqueous, solvent-type fluids, the fluids may not be compatible with a nozzle plate 18 attached to the flow feature layer of the ejection head 10 or 38. FIGS. 3-6 illustrate the construction methods for a prior art ejection head 50 containing a nozzle plate 52 attached to a flow feature layer 54. The flow feature layer 54 is made from a photoimageable material that is attached to a device surface 56 of a semiconductor substrate 58. The device surface 56 of the semiconductors substrate 58 includes the fluid ejectors 60 and circuitry therefor. Fluid from a fluid cartridge 30 is provided through a fluid supply via 62 to fluid channels 64 for flow to fluid chambers 66 where activation of the fluid ejectors 60 causes the fluid to be expelled through nozzles 68 in the nozzle plate 52.

The prior art nozzle plate 52 is made by applying a photoresist material containing a phenoxy resin component onto a removable carrier film 72. The photoresist material contains a hydrophobicity agent. The photoresist material is dried to provide a dried photoresist layer 70 on the carrier film 72. A second photoresist material is applied to the photoresist layer 70. The second photoresist material contains a phenoxy resin component and may contain a hydrophobicity agent or be devoid of a hydrophobicity agent. Once dried, the second photoresist material provides a second photoresist layer 74 of the nozzle plate 52.

The photoresist materials for the layers 70 and 72 contain photoacid generators and may be formulated to include one or more of a multi-functional epoxy compound, a di-functional epoxy compound, a relatively high molecular weight polyhydroxy ether, an adhesion enhancer, and an aliphatic ketone solvent. For purposes of the disclosure, "difunctional epoxy" means epoxy compounds and materials having only two epoxy functional groups in the molecule. "Multifunctional epoxy" means epoxy compounds and materials having more than two epoxy functional groups in the molecule.

An epoxy component for making a photoresist formulation according to the disclosure, may be selected from aromatic epoxides such as glycidyl ethers of polyphenols. An exemplary first multi-functional epoxy resin is a polyglycidyl ether of a phenolformaldehyde novolac resin such as a novolac epoxy resin having an epoxide gram equivalent weight ranging from about 190 to about 250 and a viscosity at 130° C. ranging from about 10 to about 60.

The multi-functional epoxy component may have a weight average molecular weight of about 3,000 to about 5,000 Daltons as determined by gel permeation chromatography, and an average epoxide group functionality of greater than 3, preferably from about 6 to about 10. The amount of multifunctional epoxy resin in a photoresist formulation may range from about 30 to about 50 percent by weight based on the weight of the dried photoresist layer.

The di-functional epoxy component may be selected from di-functional epoxy compounds which include diglycidyl ethers of bisphenol-A, 3,4-epoxycyclohexylmethyl-3,4-epoxycyclo-hexene carboxylate, 3,4-epoxy-6-methylcyclohexylmethyl-3,4-epoxy-6-methylcyclohexene carboxylate, bis(3,4-epoxy-6-methylcyclohexylmethyl) adipate, and bis (2,3-epoxycyclopentyl) ether.

An exemplary di-functional epoxy component is a bisphenol-A/epichlorohydrin epoxy resin having an epoxide equivalent of greater than about 1000. An "epoxide equivalent" is the number of grams of resin containing 1 gram-equivalent of epoxide. The weight average molecular weight of the di-functional epoxy component is typically above 2500 Daltons, e.g., from about 2800 to about 3500 weight average molecular weight. The amount of the first di-functional epoxy component in a photoresist formulation may range from about 30 to about 50 percent by weight based on the weight of the cured resin.

Exemplary photoacid generators include compounds or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist formulations described herein in an amount ranging from about 5 to about 15 weight percent based on the weight of the cured resin.

Compounds that generate a protic acid when irradiated by active rays, may be used as the photoacid generator, including, but are not limited to, aromatic iodonium complex salts and aromatic sulfonium complex salts. Examples include di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenylsulfonium triflate, triphenyl-sulfonium hexafluorophosphate, triphenylsulfonium hexafluoroantimonate, triphenylsulfonium tetrakis(pentafluorophenyl)borate, 4,4'-bis[diphenylsulfonium]diphenylsulfide, bis-hexafluorophosphate, 4,4'-bis[di([beta]-hydroxyethoxy) phenylsulfonium]diphenylsulfide bis-hexafluoroantimonate, 4,4'-bis[di([beta]-hydroxyethoxy)(phenylsulfonium)diphenyl sulfide-bishexafluorophosphate 7-[di(p-tolyl)sulfonium]-2-isopropylthioxanthone hexafluorophosphate, 7-[di (p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, diphenylsulfide phenylcarbonyl-4'-diphenylsulfonium hexafluoroantimonate, diphenylsulfide 4-tert-butylphenylcarbonyl-4'-diphenylsulfonium hexafluorophosphate, 4-tert-butylphenylcarbonyl-4'-diphenylsulfonium diphenylsulfide diphenylsulfide hexafluoroantimonate, 4-tert-butylphenyl-carbonyl-4'-diphenylsulfonium tetrakis(pentafluorophenyl) borate, diphenyl [4-(phenylthio)phenyl]sulfonium hexafluoroantimonate and the like.

The hydrophobicity agent that may be used in one or more layers of the composite photoresist material include silicon containing materials such as silanes and siloxanes. Accordingly, the hydrophobicity agent may be selected from heptadecafluorodecyltrimethoxysilane, octadecyldimethylchlorosilane, octadecyltrichlorosilane, methytrimethoxysilane, octyltriethoxysilane, phenyltrimethoxysilane, t-butyl-methoxysilane, tetraethoxysilane, sodium methyl siliconate, vinyltrimethoxysilane, N-(3-(trimethoxysilyl)propyl)ethylenediamine, polymethylmethoxysiloxane, polydimethylsiloxane, polyethylhydrogensiloxane, and dimethyl siloxane. The amount of hydrophobicity agent in the cured composite film may about 0.5 to about 2 weight percent, such as from about 1.0 to about 1.5 weight percent based on total weight of the cured resin, including all ranges subsumed therein.

A solvent for use in preparing photoresist formulations is a solvent which is non-photoreactive. Non-photoreactive solvents include, but are not limited gamma-butyrolactone, C1-6 acetates, tetrahydrofuran, low molecular weight ketones, mixtures thereof and the like. The non-photoreactive solvent is present in the formulation mixture used to provide the composite film layer 52 in an amount ranging from about 20 to about 90 weight percent, such as from about 40 to about 60 weight percent, based on the total weight of the photoresist formulation. The non-photoreactive solvent typically does not remain in the cured composite film layer and is thus removed prior to or during the composite film layer curing steps.

The photoresist formulation may optionally include an effective amount of an adhesion enhancing agent such as a silane compound. Silane compounds that are compatible with the components of the photoresist formulation typically have a functional group capable of reacting with at least one member selected from the group consisting of the multi-functional epoxy compound, the difunctional epoxy compound and the photoinitiator. Such an adhesion enhancing agent may be a silane with an epoxide functional group such as 3-(guanidinyl)propyltrimethoxysilane, and a glycidoxy-alkyltrialkoxysilane, e.g., gamma-glycidoxypropylt-rimethoxysilane. When used, the adhesion enhancing agent can be present in an amount ranging from about 0.5 to about 2 weight percent, such as from about 1.0 to about 1.5 weight percent based on total weight of the cured resin, including all ranges subsumed therein. Adhesion enhancing agents, as used herein, are defined to mean organic materials soluble in the photoresist composition which assist the film forming and adhesion characteristics of the composite film layer 200 or 240 adjacent the device surface 114 of the substrate 110.

Figure 6:
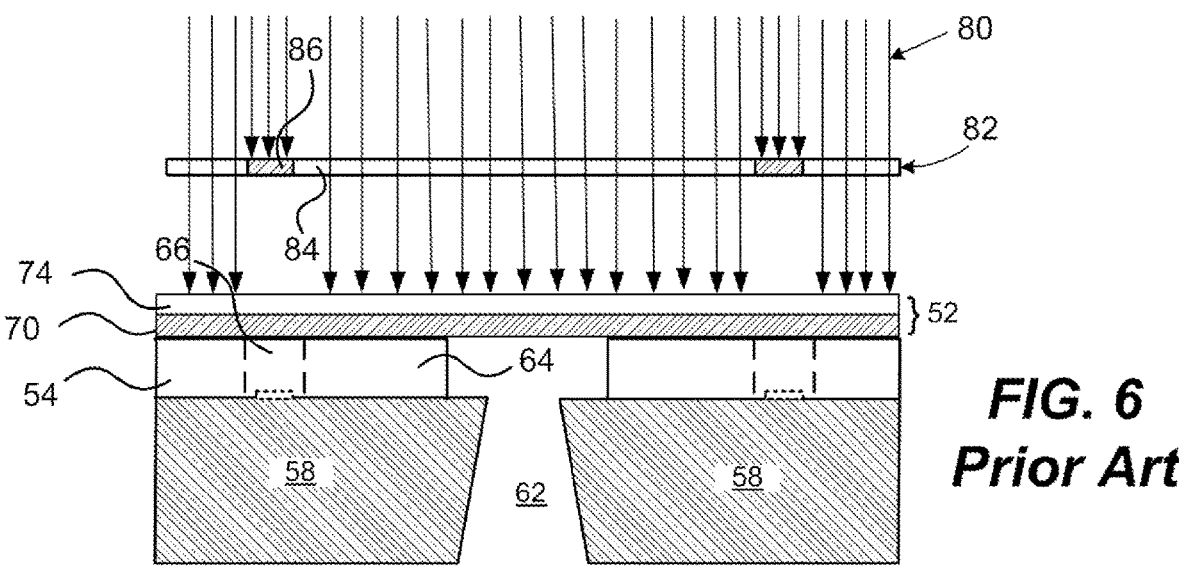
FIG. 6 is an illustration of an imaging method for the prior art composite photoresist material of FIG. 4.

The layers 70 and 74 each have a thickness ranging from about 3 to about 20 microns. Once the layers 70 and 74 are dried, the nozzle plate 52 is removed from the carrier film 72 and laminated with heat and pressure to the thick film layer 54 after an oxygen plasma treatment of the surface 76 of the thick film layer 54 and coating the surface 76 with a silane adhesion agent. With reference to FIG. 6, the nozzle holes 68 are imaged and developed in the nozzle plate 52 by using a ultraviolet (UV) radiation 80 and a mask 82 containing transparent areas 84 and opaque areas 86 therein. In the case of the nozzle plate 52 being made with negative photoresist materials, the areas imaged through the transparent areas 84 of the mask 82 are caused to be insoluble in a developing solution by cross-linking components of the photoresist material. The un-crosslinked areas that are masked by the opaque areas 86 of the mask 82 are removed from the nozzle plate 52 using a photoresist developer thereby forming the nozzle holes 68 therein. Illustrative developers that may be used include, for example, butyl cellosolve acetate, cyclohexanone, methyl ethyl ketone, a xylene and butyl cellosolve acetate mixture, and C1-6 acetates like butyl acetate, or a combination of two or more of the foregoing.

Figure 7:
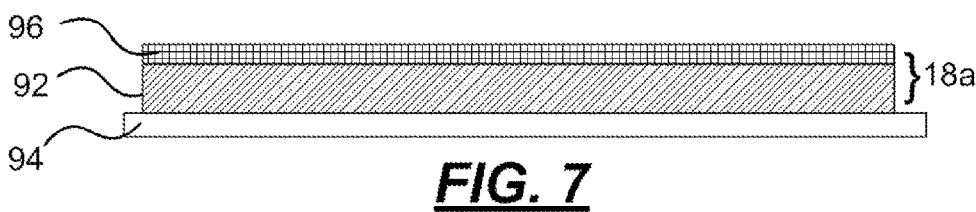
FIG. 7 is a cross-sectional view, not to scale, of a composite photoresist material according to an embodiment of the disclosure.

As set forth above, both layers 70 and 74 of the nozzle plate 52 include phenoxy resin and thus layer 70, exposed to the fluid in the thick film layer 54 is incompatible with certain organic fluids and solvents that may be supplied to the fluid channels 64 and the fluid chambers 66 formed in the thick film layer 54. In order to improve the compatibility of a nozzle plate 18a with organic fluids and solvents, the nozzle plate 18a, as shown in FIG. 7 is made. According to an embodiment of the disclosure, a layer 92 of photoresist material containing one or more phenoxy resins is coated onto a removable carrier film 94. The layer 92 may have a thickness ranging from about 3 to about 20 microns. After the layer 92 is dried, a layer of photoresist material 96 that is devoid of phenoxy resins is coated onto the layer 92 and is dried. Each of the layers 92 and 96 may include a hydrophobicity agent or may be devoid of a hydrophobicity agent.

Figure 8:
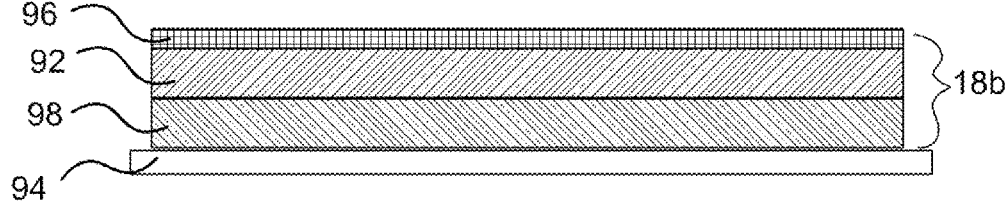
FIG. 8 is a cross-sectional view, not to scale, of a composite photoresist material according to an alternative embodiment of the disclosure.
Figure 9:
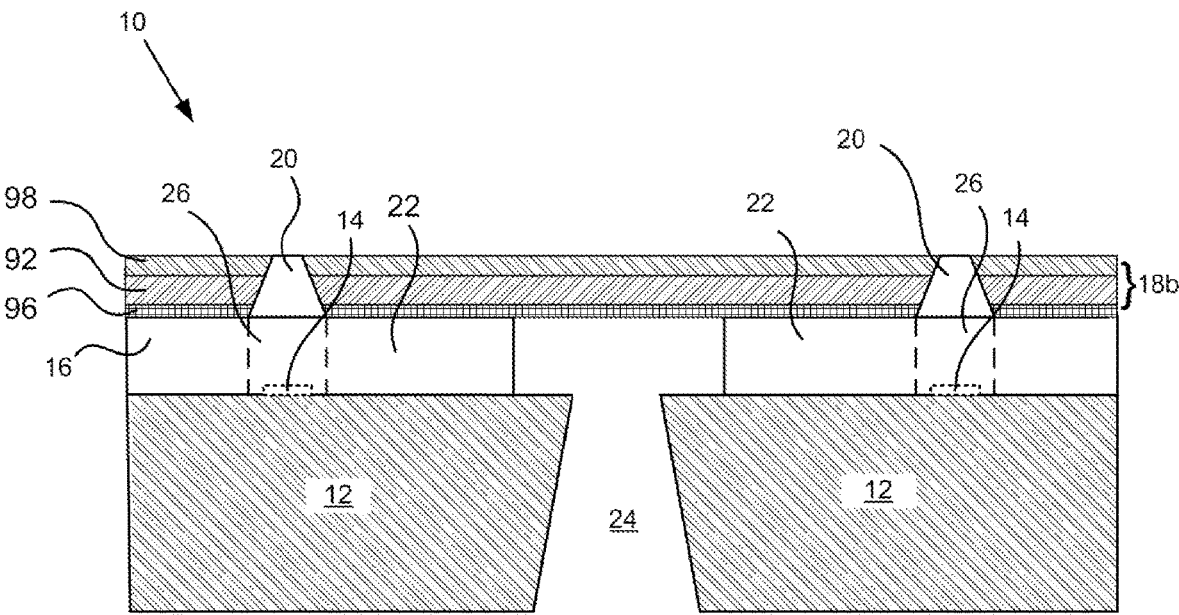
FIG. 9 is a cross-sectional view of an ejection head containing the composite photoresist material of FIG. 8.

In an alternative embodiment, illustrated in FIG. 8, a layer 98 of photoresist material is first coated onto carrier film 94 and is dried before the layer 92 is applied and dried onto layer 98. The layer 98 may have a thickness ranging from about 3 to about 20 microns. The layer 98 contains a phenoxy resin and a hydrophobicity agent. Thus, instead of a single layer 92, there are two layers, 92 and 98 that contain a phenoxy resin. The nozzle plate 18*a* or 18*b* is then laminated to a thick film layer 16 on a semiconductor substrate 12 and nozzle holes 20 are formed in the nozzle plate 18*a* or 18*b* as described above with reference to FIG. 6 to form a fluid ejection head 10 (FIGS. 1 and 9) having improved resistance to organic fluids and solvents. Accordingly, the nozzle plate 18*a* or 18*b* according to the disclosure is compatible with organic fluids and solvents provided through fluid supply via 24 in the semiconductor substrate 12 and coming in contact with the first photoresist layer 16 in the fluid channels 22 and fluid chamber 26 of the thick film layer 16.

Representative formulations for layers 92, 96 and 98 are illustrated below in the following Tables.

TABLE 1

| | Nozzle Plate 18a | |
| --- | --- | --- |
| Component | Layer 96 (phr) | Layer 92 (phr) |
| Methyl ethyl ketone solvent | balance | balance |
| Photoacid generator 1 | 3.5 | 3.5 |
| gamma-Butyrolactone solvent | 3.5 | 3.5 |
| Powder-grade phenoxy resin | 0 | 40 |
| Phenol-formaldehyde resin | 50 | 30 |
| Naphthalene epoxy resin | 50 | 30 |
| Thioxanthenone photoinitiator | 0.5 | 0.5 |
| Green Solvent Metal Complex Dye | 0.25 | 0.25 |
| 3-(guanidinyl)propyltrimethoxysilane | 2.22 | 2.22 |
| Hydrophobicity agent | 0 or 1 | 0 or 1 |
| Hydrophilic/hydrophobic | Hydrophilic or hydrophobic | Hydrophilic or hydrophobic |
| Thickness (μm) | 3 | 10 |

TABLE 2

| | Nozzle Plate 18b | | |
| --- | --- | --- | --- |
| Component | Layer 96 (phr) | Layer 92 (phr) | Layer 98 (phr) |
| Methyl ethyl ketone solvent | balance | balance | balance |
| Photoacid generator 1 | 3.5 | 3.5 | 3.5 |
| gamma-Butyrolactone solvent | 3.5 | 3.5 | 3.5 |
| Powder-grade phenoxy resin | 0 | 40 | 40 |
| Phenol-formaldehyde resin | 50 | 30 | 30 |
| Naphthalene epoxy resin | 50 | 30 | 30 |
| Thioxanthenone photoinitiator | 0.5 | 0.5 | 0.5 |
| Green Solvent Metal Complex Dye | 0.25 | 0.25 | 0.5 |
| 3-(guanidinyl)propyltrimethoxysilane | 2.22 | 2.22 | 2.22 |
| Hydrophobicity agent | 0 | 0 or 1 | 1 |
| Hydrophilic/hydrophobic | Hydrophilic | Hydrophilic or hydrophobic | Hydrophobic |
| Thickness (μm) | 3 | 10 | 10 |

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

Having described various aspects and embodiments of the disclosure and several advantages thereof, it will be recognized by those of ordinary skills that the embodiments are susceptible to various modifications, substitutions and revisions within the spirit and scope of the appended claims.

What is claimed is:

1. A method for making a fluid ejection head, comprising the steps of:

(A) applying a layer of photoresist material to a carrier film, the layer of photoresist material comprising a phenoxy resin;

(B) drying the layer to provide a dried layer;

(C) applying a layer of photoresist material devoid of a phenoxy resin to the dried layer;

(D) drying the layer devoid of the phenoxy resin to provide a composite photoresist laminate nozzle plate; and (E) laminating the composite photoresist laminate nozzle plate to a flow feature layer to provide the fluid ejection head, wherein the photoresist layer devoid of a phenoxy resin is configured to be adjacent to the flow feature layer of the fluid ejection head.

2. The method of claim 1, further comprising (F) imaging and developing nozzle holes in the composite photoresist laminate nozzle plate.

3. The method of claim 1, wherein the layer of photoresist material applied to the carrier film comprises a first layer of photoresist material containing a phenoxy resin and a hydrophobicity agent and a second layer of photoresist material containing a phenoxy resin, wherein the second layer of photoresist material is devoid of a hydrophobicity agent.

4. The method of claim 3, wherein the hydrophobicity agent is selected from the group consisting of heptadecafluorodecyltrimethoxysilane, octadecyldimethylchlorosilane, octadecyltrichlorosilane, methyltrimethoxysilane, octyltriethoxysilane, phenyltrimethoxysilane, t-butylmethoxysilane, tetraethoxysilane, sodium methyl siliconate, vinyltrimethoxysilane, N-(3-(trimethoxysilyl)propyl) ethylenediamine, polymethylmethoxysiloxane, polydimethylsiloxane, polyethylhydrogensiloxane, and dimethyl siloxane.

5. The method of claim 1, wherein the composite photoresist nozzle plate is devoid of a hydrophobicity agent.

6. The method of claim 1, wherein the photoresist layer devoid of a phenoxy resin is also devoid of a hydrophobicity agent.

7. The method of claim 1, wherein the photoresist layer devoid of a phenoxy resin has a thickness ranging from about 3 to about 10 microns.

8. The method of claim 1, wherein the photoresist layer containing a phenoxy resin has a thickness ranging from about 3 to about 20 microns.

9. The method of claim 1, further comprising applying a third photoresist layer adjacent to the photoresist layer containing the phenoxy resin, wherein the third photoresist layer contains a phenoxy resin and a hydrophobicity agent.

10. The composite photoresist material method of claim 9, wherein the third photoresist layer has a thickness ranging from about 3 to about 20 microns.

11. A method for making a fluid ejection head, comprising:

(A) applying a layer of photoresist material to a carrier film, the layer of photoresist material comprising a phenoxy resin;

(B) drying the layer to provide a dried layer;

(C) applying a layer of photoresist material devoid of a phenoxy resin to the dried layer;

(D) drying the layer devoid of the phenoxy resin to provide a composite photoresist laminate nozzle plate;

(E) removing the composite photoresist laminate nozzle plate from the carrier film;

(F) laminating the composite photoresist laminate nozzle plate to a flow feature layer attached to a semiconductor substrate, wherein the photoresist layer devoid of a phenoxy resin is configured to be adjacent to the flow feature layer of the fluid ejection head; and (G) imaging and developing nozzle holes in the composite photoresist laminate nozzle plate to provide the fluid ejection head.

12. The method of claim 11, wherein the composite photoresist nozzle plate is devoid of a hydrophobicity agent.

13. The method of claim 11, wherein the photoresist layer devoid of a phenoxy resin is also devoid of a hydrophobicity agent.

14. The method of claim 11, wherein the photoresist layer devoid of a phenoxy resin has a thickness ranging from about 3 to about 10 microns.

15. The method of claim 11, wherein the photoresist layer containing a phenoxy resin has a thickness ranging from about 3 to about 20 microns.

16. The method of claim 11, further comprising applying a third photoresist layer adjacent to the photoresist layer containing the phenoxy resin, wherein the third photoresist layer contains a phenoxy resin and a hydrophobicity agent.

17. The composite photoresist material method of claim 16, wherein the third photoresist layer has a thickness ranging from about 3 to about 20 microns.

* * * * *